US008890119B2

(12) United States Patent
Doyle et al.

(10) Patent No.: US 8,890,119 B2
(45) Date of Patent: Nov. 18, 2014

(54) VERTICAL NANOWIRE TRANSISTOR WITH AXIALLY ENGINEERED SEMICONDUCTOR AND GATE METALLIZATION

(71) Applicants: Brian S. Doyle, Portland, OR (US); Roza Kotlyar, Portland, OR (US); Uday Shah, Portland, OR (US); Charles C. Kuo, Union City, CA (US)

(72) Inventors: Brian S. Doyle, Portland, OR (US); Roza Kotlyar, Portland, OR (US); Uday Shah, Portland, OR (US); Charles C. Kuo, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/719,093

(22) Filed: Dec. 18, 2012

(65) Prior Publication Data
US 2014/0166981 A1 Jun. 19, 2014

(51) Int. Cl.
*H01L 29/06* (2006.01)
*H01L 21/02* (2006.01)
*H01L 29/66* (2006.01)
*B82Y 99/00* (2011.01)

(52) U.S. Cl.
CPC ........ *H01L 29/0669* (2013.01); *H01L 21/0237* (2013.01); *Y10S 977/762* (2013.01); *H01L 29/66666* (2013.01); *B82Y 99/00* (2013.01)
USPC ............................. 257/24; 257/25; 977/762

(58) Field of Classification Search
USPC ...................................... 257/24–25; 977/762
See application file for complete search history.

(56) References Cited

U.S. PATENT DOCUMENTS

| | | | |
|---|---|---|---|
| 6,921,700 B2 | 7/2005 | Orlowski et al. | |
| 7,087,920 B1 | 8/2006 | Kamins | |
| 7,285,829 B2 | 10/2007 | Doyle et al. | |
| 7,666,727 B2 | 2/2010 | Doyle et al. | |
| 7,781,771 B2 | 8/2010 | Lindert et al. | |
| 7,825,032 B2 | 11/2010 | Bakkers et al. | |
| 8,063,450 B2 | 11/2011 | Wernersson et al. | |
| 8,294,180 B2 | 10/2012 | Doyle et al. | |
| 2005/0224888 A1 | 10/2005 | Graham et al. | |
| 2009/0008631 A1* | 1/2009 | Hurkx et al. | 257/25 |
| 2010/0059807 A1 | 3/2010 | Cho et al. | |
| 2010/0295021 A1 | 11/2010 | Chang et al. | |
| 2011/0108803 A1 | 5/2011 | Deligianni et al. | |
| 2011/0233512 A1* | 9/2011 | Yang et al. | 257/9 |

OTHER PUBLICATIONS

International Application No. PCT/US2011/065916 filed Dec. 19, 2011, titled, "High Voltage Field Effect Transistors," 41 pages.
International Search Report and Written Opinion for Application No. PCT/US2011/065916 dated Sep. 25, 2012, 7 pages.
International Search Report and Written Opinion mailed Sep. 24, 2013 for PCT/US2013/047388 filed Jun. 24, 2013.

* cited by examiner

*Primary Examiner* — A. Sefer
(74) *Attorney, Agent, or Firm* — Blakely, Sokoloff, Taylor & Zafman LLP (57) ABSTRACT

Vertically oriented nanowire transistors including semiconductor layers or gate electrodes having compositions that vary over a length of the transistor. In embodiments, transistor channel regions are compositionally graded, or layered along a length of the channel to induce strain, and/or include a high mobility injection layer. In embodiments, a gate electrode stack including a plurality of gate electrode materials is deposited to modulate the gate electrode work function along the gate length.

18 Claims, 10 Drawing Sheets

VERTICAL NANOWIRE TRANSISTOR WITH AXIALLY ENGINEERED SEMICONDUCTOR AND GATE METALLIZATION

TECHNICAL FIELD

Embodiments of the invention generally relate to Metal-Oxide-Semiconductor Field Effect Transistors (MOSFETS) employed in microelectronics, and more particularly relate to vertically oriented nanowire MOSFETS.

BACKGROUND

Conventional MOS transistors are typically laterally oriented with the two source/drain regions separated by a distance across a top surface of a substrate. In so-called "planar" and "non-planar" transistors, such as a tri-gate or nanowire transistor with a "gate all around" architecture, the first source/drain material is typically the same as that of the second source/drain material because it is difficult to controllably fabricate one of the source/drain materials selectively to the other, particularly in view of the minute lateral spacing between them (e.g., ~30 nm, or less). As such, achieving lateral FETs with high drive current and/or low leakage currents is becoming increasingly difficult with continued scaling of transistor dimensions.

In vertically oriented MOS transistors (i.e., vertical FETs), a first source/drain is disposed over a second source/drain layer with a gate electrode controlling a channel disposed between the first and second source/drain. Typical vertical FETs have a substantially homogenous crystalline composition, with only dopant species varying, and are fabricated, for example, by implanting a dopant species (e.g., n-type) in a first source/drain region substantially as is done for laterally oriented devices. A vertical pillar of semiconductor is then patterned (e.g., by anisotropic etch) through the implanted source/drain to expose underlying semiconductor, at which point and a second implant is performed to form the second source/drain. Finally, a gate stack is formed. While such vertically oriented transistors may find application in devices where laterally oriented MOS transistors are disadvantaged by other system-level constraints (e.g., in memory devices where vertically-oriented memory structures exist, access transistors may be advantageously oriented in the vertical, as well), the conventional vertical transistor offers little advantage over planar devices with respect to drive current and/or leakage current, etc.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not structurally or functionally exclusive of the other.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material layer with respect to other components or layers where such physical relationships are noteworthy for mechanical components in the context of an assembly, or in the context of material layers of a micromachined stack. One layer (component) disposed over or under another layer (component) may be directly in contact with the other layer (component) or may have one or more intervening layers (components). Moreover, one layer (component) disposed between two layers (components) may be directly in contact with the two layers (components) or may have one or more intervening layers (components). In contrast, a first layer (component) "on" a second layer (component) is in direct contact with that second layer (component).

Embodiments of vertical nanowire transistors described herein employ semiconductor and/or gate electrode compositional differentiation along a longitudinal length of the transistor. In other words, parallel to the axial direction of current flow in the nanowire transistor, the composition of at least one of source, drain, and channel semiconductor, or gate electrode is varied. As employed herein, "composition" refers only to the intrinsic neutral semiconductor lattice atoms, and is exclusive of extrinsic donor or acceptor elements. In certain such embodiments, the axially engineered transistor achieves higher "on-state" (drive) currents and/or lower "off-state" (leakage) currents than a similarly dimensioned vertical nanowire transistor of conventional, substantially homogenous composition. Generally, the vertical orientation of the nanowire transistors described herein are utilized to implement compositional changes between the first and second source/drain regions of the transitory that are parallel to the source-to-drain current flow (i.e., parallel to the gate length $L_g$). Such embodiments leverage the atomic layer control afforded by epitaxial and certain deposition processes (e.g., atomic layer deposition). While such processes have been previously employed in the fabrication of lateral FETs, any compositional changes made with such processes would typically be perpendicular to the direction of current flow (i.e., perpendicular to $L_g$). As described further herein, a number of device performance enhancements are possible through axially engineering a nanowire MOSFET.

Figure 1:
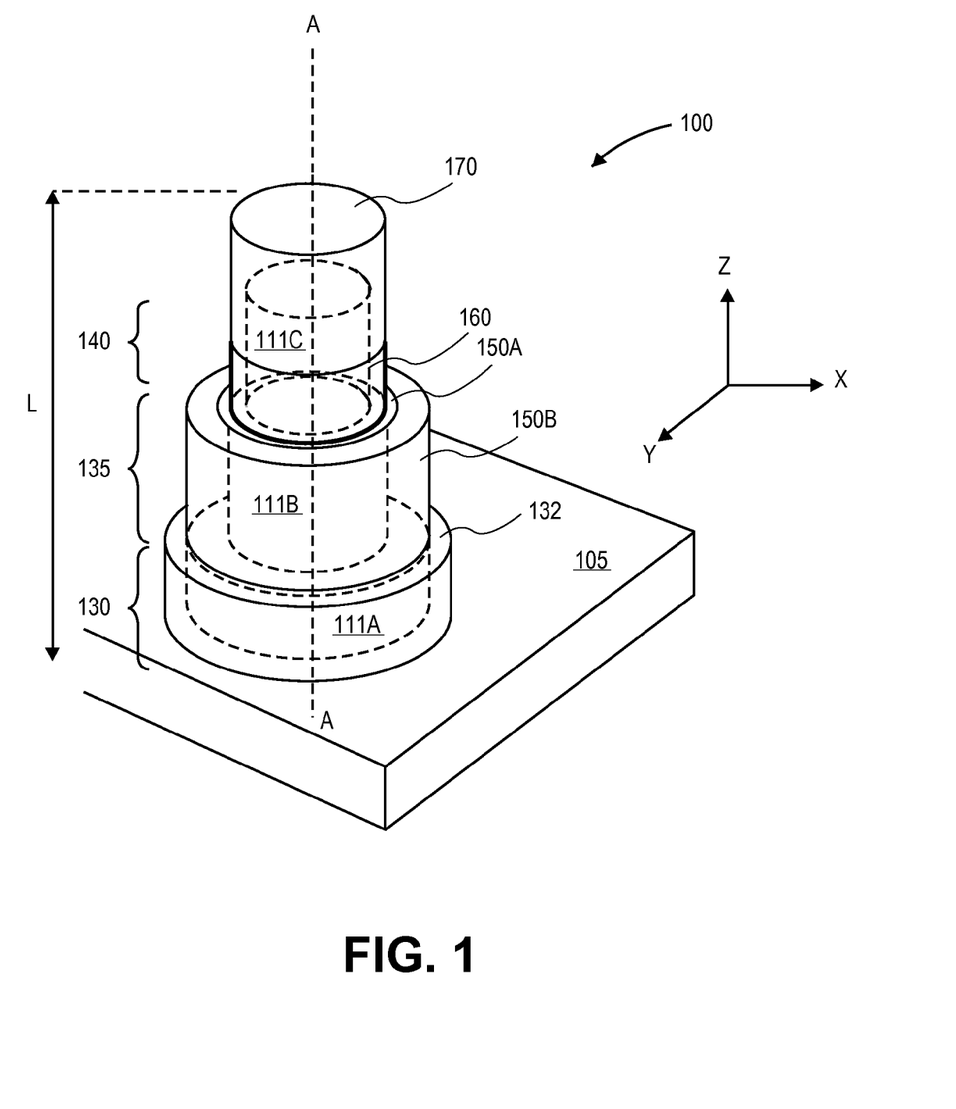
FIG. 1 is an isometric illustration of a vertical nanowire transistor, in accordance with an embodiment.

FIG. 1 is an isometric illustration of an exemplary vertical nanowire transistor 100, which may be fabricated in accordance with embodiments of the present invention to have a compositional variation along the length of the longitudinal axis A (denoted in dashed line in FIG. 1). For the vertical nanowire transistor 100, a semiconductor nanowire is vertically oriented with respect to the substrate 105 so that the longitudinal length L spanning both source/drain regions is along the z dimension (perpendicular to the plane of the top surface of the substrate 105) and the transverse nanowire width W (e.g., 5-50 nm) has a correspondence with an area of the substrate 105 occupied by the nanowire. The vertical transistor 100 comprises one or more semiconductor materials along the longitudinal length L in one or more of the functional regions of the transistor including the channel region 135 disposed between a drain region 140, and a source region 130. In this configuration, the source of the transistor 100 is disposed on the substrate 105. Alternatively however, the transistor 100 may be inverted to have a "drain down" orientation. In the vertical form, the transistor 100 has critical dimensions, such as channel length or $L_g$ (e.g., 15 nm) defined by material layer thickness, which can be very well-controlled (e.g., to 1 nm) by either epitaxial growth or atomic layer deposition (ALD) processes, for example. Furthermore, epitaxial layer thicknesses are not further constrained by resistivity surface scattering concerns typical of lateral devices.

Generally, the substrate 105 is a crystalline semiconductor (e.g., substantially monocrystalline) with one embodiment being group IV materials (e.g., Si, Ge, SiGe, SiC) and another embodiment being group III-V materials (e.g., InAlAs, AlGaAs, etc.). In embodiments, the top surface of the substrate 105 is a (110) crystal surface, in which case the transistor channel orientation is <110>. In another embodiment, the top surface of the substrate 105 is a (100) crystal surface, in which case the transistor channel orientation is <100>. Depending on the embodiment, the substrate 105 may include one or more buffer layer and/or transitional layers where the transistor 100 is disposed on a non-silicon top surface. The buffer layer may be any metamorphic system known in the art to accommodate one or more of lattice or thermal mismatch between an underlying handling substrate, typically silicon, and the non-silicon semiconductor surface material (e.g., Ge, III-V, etc.). Transitional layers may be any pseudomorphic layers (e.g., of varying SiGe concentrations, or of varying III-V compositions) disposed on the buffer to arrive at the top (growth) surface of the substrate 105.

Semiconductor layers employed for the nanowire transistor 100 may be group IV (e.g., Si, Ge, or SiGe alloys), group III-V (e.g., InAs, InGaAs, InAlAs, etc.), or a combination of both (i.e., a layer of Ge and one or more group III-V layers). In the exemplary embodiment, the source region 130 is disposed on the substrate 105, and is of at least one source semiconductor layer 111A, which may be the same material as the top semiconductor surface of the substrate 105 (e.g., silicon). The source semiconductor is heavily doped (e.g., n-type for an NMOSFET) at any doping level conventional in the art. Where the source semiconductor layer 111A is an alloy, a low band gap material may be used for NMOSFET embodiments. In contact with the source semiconductor layer 111A is either a contact metallization (e.g., silicide, etc., not depicted), or an embedded source line may be present in the substrate 105 (not depicted) to contact the bottom surface of the source semiconductor layer 111A. A dielectric 132 completely surrounds the source semiconductor layer 111A and or contact metallization.

Disposed over the source semiconductor layer 111A is a channel semiconductor layer 111B. The channel semiconductor layer 111B, as further described herein, may include one or more compositional variations as a function of $L_g$. Generally however, the channel semiconductor layer 111B is undoped or lightly doped with a steep transition of dopant species concentration in the source semiconductor being at the interface between the channel semiconductor layer 111B and the source semiconductor layer 111A. In the exemplary embodiment, the n-type (or p-type) doping of the source semiconductor 111A abuts the lightly doped, or intrinsic channel semiconductor 111B to approximate a δ-doping profile where dopant concentration changes by at least an order of magnitude (e.g., from >1 e20 cm$^{-3}$ to <1 e19 cm$^{-3}$) over a change in L (or z-height) no greater than 2-3 nm. Such an abrupt profile is a hallmark of an in-situ doped epitaxial layer transition between a source/drain region and a channel layer that cannot be duplicated with convention implantation techniques. The transistor 100 includes a gate stack coaxially wrapping completely around the nanowire within the channel region 135. The gate stack entails a metal gate electrode 150B dispose around a dielectric layer 150A. As shown, the gate electrode 150B is insulated from the source semiconductor 111A by the dielectric 132. The gate dielectric 150A may be any known in the art, and is avantageously a high-k material (e.g., >10), like $HfO_2$, $ZrO_2$, or other metal-oxide, and the composition and electrical properties of the gate metal 150B are described in further detail elsewhere herein.

Disposed over the channel semiconductor layer 111B is the drain semiconductor layer 111C. The drain semiconductor layer 111C may be the same composition as the source semiconductor 111A (e.g., silicon), or different (e.g., SiGe), as described further elsewhere herein. In either case, the drain semiconductor layer 111C is similarly heavily doped (e.g., n-type for an NMOSFET) at any doping level conventional in the art. Where the source semiconductor layer 111A is an alloy, a low band gap material may be used for NMOSFET embodiments. In the exemplary embodiment, the n-type (or p-type) doping of the drain semiconductor 111C approximates a δ-doping where the doping concentration transitions up by an order of magnitude, or more, from that of the channel semiconductor layer 111B, within a first 2-3 nm of the drain semiconductor layer 111C. A top drain contact metallization 170 is further disposed on the drain semiconductor layer 111C, for example coaxially wrapping completely surround the semiconductor. A second dielectric 160 separates the metallization 170 from the gate electrode 150B.

The transistor 100 has critical dimensions, such as $L_g$ (i.e., portions of the longitudinal length L), defined by epitaxial layer thicknesses, which can be very well controlled (e.g., to 1 nm) by the growth process. Furthermore, with epitaxial layer growth defining lengths of the nanowire, material composition may be readily tailored to achieve the band gap and mobility differentiation, as further described in the context of FIGS. 2A-2G.

Figure 2A:
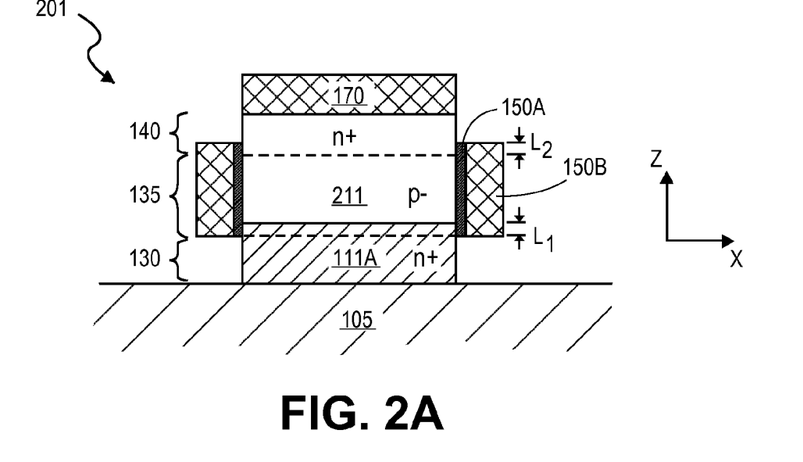
FIG. 2A is a cross-sectional view of a vertical nanowire transistor with an axially differentiated source and drain semiconductor, in accordance with embodiments.

In an embodiment, a vertical nanowire transistor includes a source semiconductor with a higher density of states effective electron mass in the plane perpendicular to transport (x-y plane) and/or lower transport mass (z-direction) than that of the channel semiconductor. Such embodiments will have higher transistor drive current than conventional devices. FIG. 2A illustrates a cross-sectional view of a vertical nanowire transistor 201 with an axially differentiated source and drain semiconductor to provide a differentiation in effective mass, in accordance with embodiments. The vertical nanowire transistor 201 is one embodiment of the vertical nanowire transistor 100 with reference numbers carried through from FIG. 1 to identify like features. As shown in FIG. 2A, a first substantially monocrystalline semiconductor layer 111A is employed for the source region 130, while a second substantially monocrystalline semiconductor layer 211 is employed for both the channel region 135 and drain region 140, with only a difference in doping (e.g., p− to n+, respectively) occurring at the dashed line representing the interface between these two regions. In certain such embodiments, the semiconductor layer 111A is of a material having an effective transport mass lighter than that of the semiconductor layer 211.

For example, in one group IV embodiment, the semiconductor layer 111A is Ge or a SiGe alloy, advantageously having a Ge concentration of 70% or more, while the semiconductor layer 211 is silicon or a SiGe alloy of substantially lower Ge content. In one exemplary group III-V embodiment, the semiconductor layer 111A is InAs, while the semiconductor layer 211 employed for the channel and drain has lower In content (e.g., a ternary alloy such InGaAs with 53% of In). In one hybrid group IV-III/V embodiment, the semiconductor layer 111A is Ge, while the semiconductor layer 211 is GaAs (lattice matched to Ge). In another hybrid embodiment, the semiconductor layer 111A is Ge, while the semiconductor layer 211 is AlAs (Ge and AlAs are nearly lattice matched).

Figure 2B:
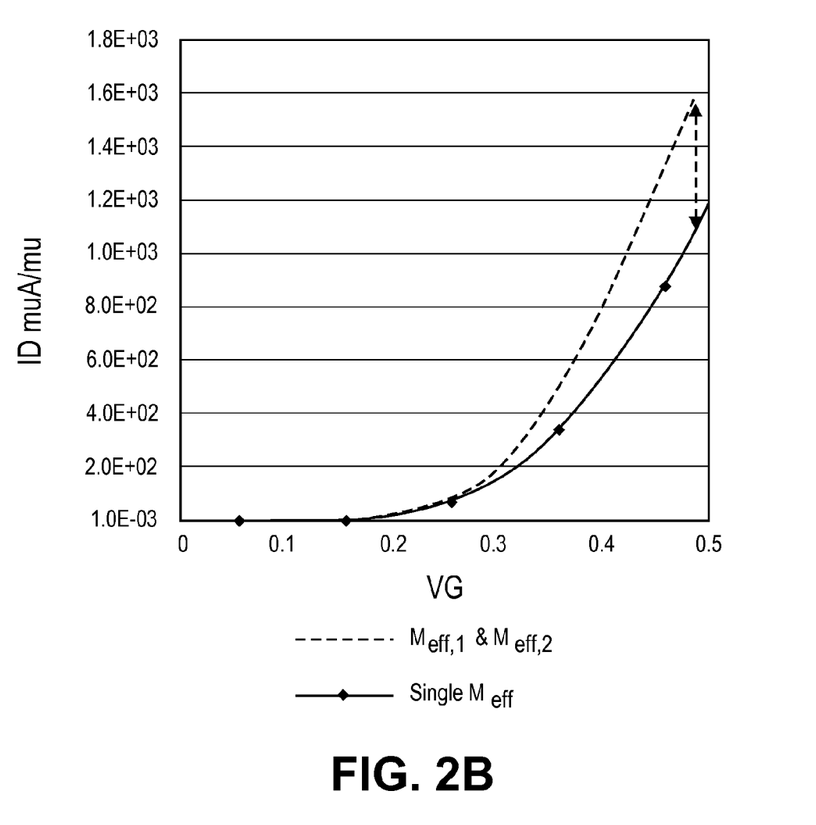
FIG. 2B is a graph showing a simulation comparing a transistor with one effective electron mass compared to a transistor with two effective electron masses, in accordance with an embodiment.

For these exemplary embodiments, the greater density of states (DOS) mass leads to an advantageous increase in FET drive current ($I_{on}$). FIG. 2B is a graph showing simulations utilizing non-equilibrium Greens function (NEGF) quantum transport of a transistor structure having one effective electron mass as compared to a transistor structure having two effective electron masses, in accordance with an embodiment. As shown, for a particular gate voltage (e.g., $V_g$=0.5V), drive current in a multi-gate transistor having a $L_g$ of 15 nm and transverse body width of 5 nm increases by approximate 50% where the density of states effective electron mass for the semiconductor layer 111A is twice that of the semiconductor layer 211 for an equal leakage ($I_{off}$) current.

As shown in FIG. 2A, in the exemplary embodiment, portions of the channel region 135 include the semiconductor layer 211 and the semiconductor layer 111A with a "source" end of the channel region 135 being of different composition than the "drain end" of the channel region 135. Notably, where the transistor 201 is interconnected in a working circuit, the semiconductor layer 111A may advantageously be an interconnect linking to another transistor, for example as further illustrated in FIG. 2E. As shown in FIG. 2A, the semiconductor layer 111A is amendable to deposition of an annular source contact metallization (not depicted). In embodiments, the dopant (e.g., n-type species) concentration profile transitions at a point below the interface of the semiconductor layers 111A and 211, as is denoted by the dashed line passing through the semiconductor layer 111A corresponding to the δ-dopant profile transition. The bottom of the gate stack is aligned in the z-dimension relative to the interface between the semiconductor layer 211 and the semiconductor layer 111A so as to have the appropriate overlap $L_1$, which may be on the order of 2-4 nm, ensuring conductivity of the lightly doped portion of the semiconductor layer 111A is controllable by the gate electrode during transistor operation. As further shown in FIG. 2A the z-dimension film thickness of the gate electrode 150B may extend past the drain end of the channel (overlay $L_2$) as the channel length is defined by the epitaxial growth process, not the z-dimension thickness of the gate electrode 150B.

Figure 2C:
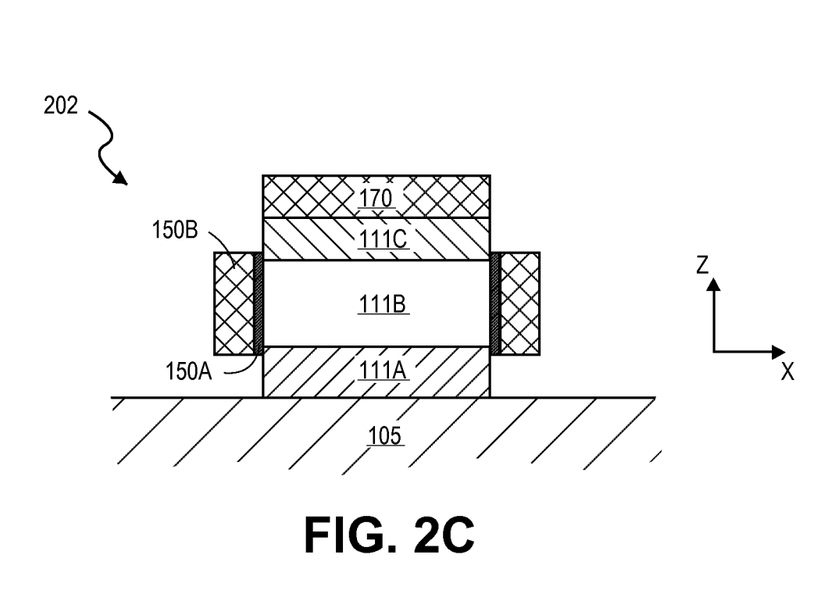
FIGS. 2C and 2D are cross-sectional views of vertical nanowire transistors with a strained semiconductor channel, in accordance with embodiments.
Figure 2D:
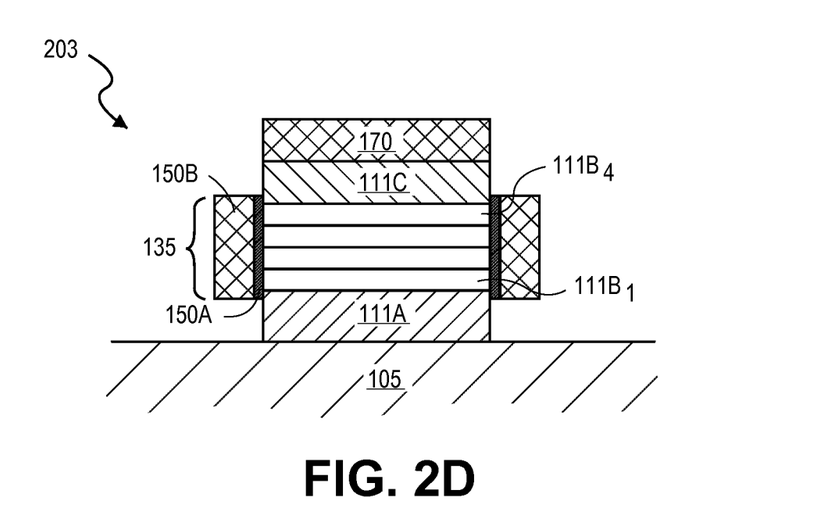

In an embodiment, the channel semiconductor layer of a vertical nanowire MOSFET is strained by using a different semiconductor material for the channel layer than for at least the source region. Such strain may be induced by forming the semiconductor channel pseudomorphically from the interface of the source semiconductor layer and/or by grading the semiconductor composition over the length of the channel. FIG. 2C illustrates cross-sectional view of a vertical nanowire transistor 202, having strained pseudomorphic semiconductor channel, in accordance with embodiments, while FIG. 2D illustrates a cross-section view of a vertical nanowire transistor 203, having a semiconductor channel compositionally graded in a direction parallel to current flow. The vertical nanowire transistors 202 and 203 are embodiments of the vertical nanowire transistor 100 with reference numbers carried through from FIG. 1 to identify like features.

Referring to FIG. 2C, the transistor 202 includes a source semiconductor layer 111A of, for example, p-type silicon with the channel semiconductor 111B composed of SiGe. In the exemplary embodiment, the drain semiconductor 111C is then again p-type silicon with both the source and drain regions then placing the opposite ends of the channel under compressive stress in a plane perpendicular to the axial direction of current flow through the channel (i.e., a transverse stress), which produces a favorable band splitting improving hole mobility through the channel. Likewise, as an exemplary III-V source semiconductor where the source semiconductor layer 111A is n-type InAs, the channel semiconductor 111B InGaAs is placed under tensile stress in a plane perpendicular to the axial direction of current flow through the channel (i.e., a transverse stress), which produces a favorable band splitting improving electron mobility through the channel. III-V PMOS device examples include a source semiconductor layer 111A of $Al_{0.35}In_{0.65}Sb$ and a drain semiconductor layer 111C of $Al_{0.4}In_{0.6}Sb$, with a compressively strained InSb channel semiconductor layer 111B there between. In another PMOS III-V embodiment, the channel semiconductor layer 111B is GaSb compressively strained by a GaAs source semiconductor layer 111A and drain semiconductor 111C. In one exemplary hybrid group IV/group III-V embodiment, a Ge source semiconductor layer 111A, and an InGaAs (with In>0) channel semiconductor layer 111B are disposed below a Ge drain semiconductor layer 111C. In another exemplary hybrid group IV/group III-V embodiment, a tensilely stressed Ge source semiconductor layer 111A, and an InGaAs (with In>0) channel semiconductor layer 111B are disposed below an InGaAs (with In>0) drain semiconductor layer 111C.

Referring to FIG. 2D, the channel region 135 includes a channel semiconductor that is compositionally graded along a length of the channel (z-height), represented by the plurality of layers $111B_1$-$111B_4$. In one exemplary group IV embodiment, the Ge concentration in a SiGe channel semiconductor is graded. In one exemplary group III-V embodiment, In concentration is graded within an InGaAs channel region with Indium higher near the source. In another exemplary group III-V embodiment, In concentration is graded within an InGaSb channel region with Indium higher near the source. In one exemplary hybrid group IV/III-V embodiment with a Ge source and InGaAs channel, Indium is higher near the source end and graded down towards the drain end. Unlike for a lateral device, such grading along the channel length enables a tuning of the conduction and/or valence bands. Grading along the channel length may also enable greater control of stress/strain within the channel such that more stress may be applied at the source end of the channel than at the drain end of the channel. This length-wise, or axial, band engineering may also advantageously enable, or enhance transistor threshold voltage ($V_t$) tuning for a gate electrode 150B having a particular work function. For example, as the valence band energy is increased, the threshold voltage is lowered by an amount approximately equal to the valance band voltage offset.

In embodiments, a concentration of Ge between source and drain ends of the channel region 135 varies by between 5 and 50 percent. In one advantageous embodiment, a first portion of a channel region 135 having about 25 percent germanium will have a threshold voltage magnitude approximately 300 mV less than that of a second portion of the channel region 135 having no Ge (e.g., pure silicon). In one such embodiment, a higher Ge concentration is present at the interface of the source semiconductor layer 111A and is decreased to a lower Ge concentration over at least a portion of the thickness of the channel semiconductor 111B (e.g., over 10-20 nm). As one extreme example, the Ge is graded down in concentration (e.g., linearly) to pure silicon at the drain end of the channel region 135.

Figure 2E:
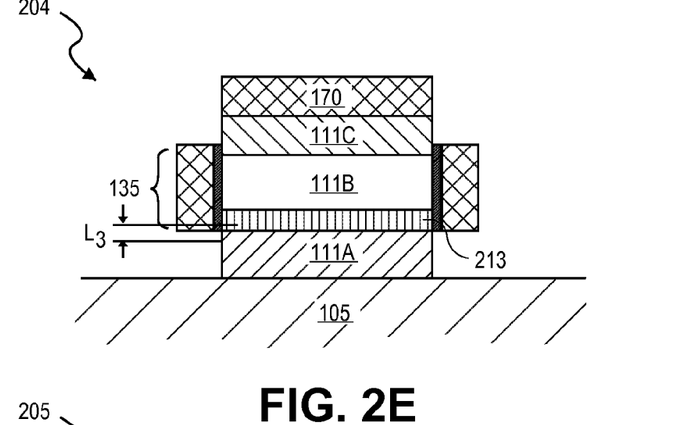
FIG. 2E is a cross-sectional view of a vertical nanowire transistor with an enhanced velocity injection layer, in accordance with an embodiment.

In embodiments, a vertical nanowire transistor includes a high mobility injector layer at the source end of the channel region. FIG. 2E illustrates a cross-sectional view of a vertical nanowire transistor 204 including an enhanced velocity injection layer, in accordance with an embodiment. As shown, the channel region 135 includes an epitaxial injection layer 213 disposed on the source semiconductor layer 111A. The injection layer 213 is of a different composition than the channel semiconductor layer 111B, and more particularly is of a composition offering higher carrier mobility than the channel semiconductor layer 111B. The injection layer 213 is advantageously lightly doped or intrinsic semiconductor. In one exemplary group IV embodiment, the injection layer 213 is Ge while the channel semiconductor layer 111B is either pure silicon or a SiGe alloy. In one exemplary group III-V embodiment, the injection layer 213 is InAs with the channel semiconductor layer 111B composed of InGaAs with lower percent of In. In another exemplary group III-V embodiment, the injection layer 213 is InSb with the channel semiconductor layer 111B composed of InGaSb with lower percent of In. In one exemplary hybrid group IV/group III-V embodiment having a source of Ge, the injection layer 213 is GaAs with the channel semiconductor layer 111B composed of AlAs.

In vertical nanowire transistors including the injection layer 213, the source semiconductor layer 111A is of a different composition than that of the injection layer 213. For example, a Ge injection layer 213 may be disposed on a silicon source semiconductor layer 111A, or a SiGe source semiconductor layer 111A. As further depicted in FIG. 2E, a bottom portion of the gate stack (gate dielectric 150A and gate electrode 150B) is disposed adjacent to the entire thickness of the injection layer 213 in the exemplary embodiment where the dopant concentration within the injection layer 213 is advantageously less than that present in the source semiconductor layer 111A. Therefore, where the source semiconductor layer 111A has the exemplary δ-doping profile, the dopant species concentration may decline by an order of magnitude, or more over the thickness of the injection layer 213, which may range from 2-5 nm. The gate stack however may be disposed more or less above/below the material transition between the injection layer 213 and the source semiconductor 111A, as represented by the overlap $L_3$ in FIG. 2E. For example, with the source dopant species profile independent of the gate stack position, the gate stack may extend around a partial thickness (i.e., top portion) of the source semiconductor layer 111A. Similarly, where a delta doping profile extends through at least a portion of the injection layer 213 (i.e., a bottom portion of the injection layer 213 is heavily doped), that portion of the injection layer 213 may extend below the gate stack.

Figure 2F:
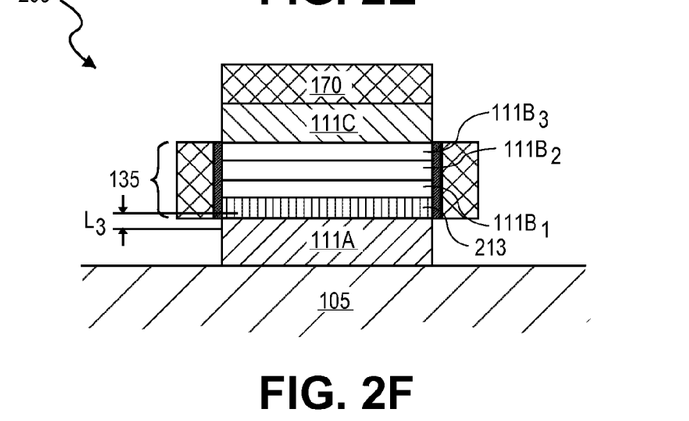
FIG. 2F is a cross-sectional view of a vertical nanowire transistor with a strained semiconductor channel and an enhanced velocity injection layer, in accordance with an embodiment.

In embodiments, a vertical nanowire transistor includes an injection layer and a compositionally graded channel. As illustrated in FIG. 2F, the vertical nanowire transistor 205 includes the epitaxial injection layer 213 disposed on the source semiconductor layer 111A with the remainder of the channel region 135 including successive thicknesses of differing composition, represented as the semiconductor layers $111B_1$, $111B_2$, and $111B_3$. In the transistor 205, the compositional grading may be any of those described for the transistor 203. For example, grading may be performed from a pure Ge injection layer 213 decreasing (e.g., linearly) to a lowest Ge concentration for the layer $111B_3$.

Figure 2G:
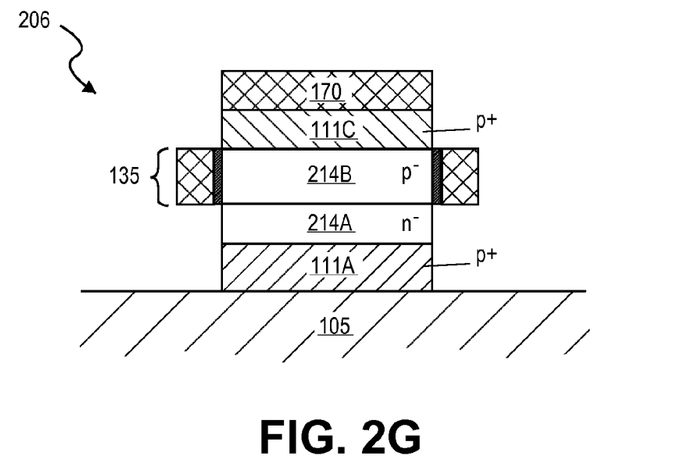
FIG. 2G is a cross-sectional view of a vertical nanowire transistor with a thyristor-type active layer stack, in accordance with an embodiment.

In embodiments, a vertical nanowire transistor includes three or more pan junctions along the axial length of the device. FIG. 2G illustrates a vertical nanowire transistor 206 with thyristor-like architecture. As shown, an n– doped semiconductor layer 214A is disposed on a p+ doped source semiconductor layer 111A. Surrounded by gate stack within the channel region 135 is further a p– doped semiconductor layer 214B disposed on the n– doped semiconductor layer 214A with an n+ doped drain semiconductor layer 111C completing the epitaxial device stack. For one such an embodiment, the composition of all the epitaxial layers may all be substantially the same (e.g., all silicon). Alternatively, the dopant junctions depicted in FIG. 2G may accompany compositional variations along the axial length, for example including one or more of the embodiments described elsewhere herein (e.g., a compositionally graded channel, etc.).

Figure 3A:
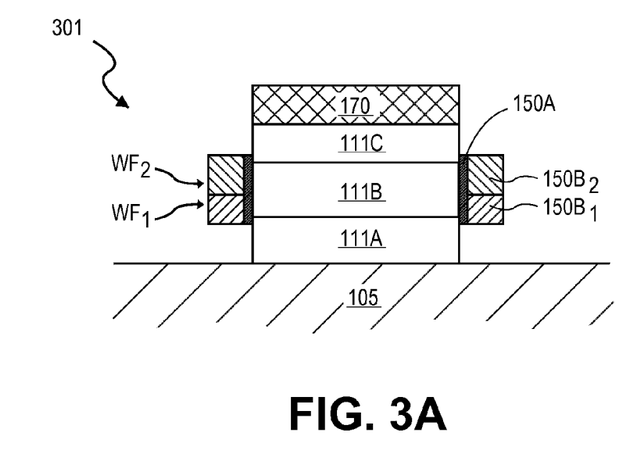
FIG. 3A is a cross-sectional view of a vertical nanowire transistor with an axially engineered gate electrode work function, in accordance with an embodiment.

In embodiments, vertical nanowire transistors include a plurality of gate electrode materials, or a variation in material composition, across the channel length to modulate the gate electrode work function axially, along the channel length. FIG. 3A illustrates a cross-sectional view of a vertical nanowire transistor 301 with an axially engineered gate electrode, in accordance with an embodiment. The vertical nanowire transistor 301 is an embodiment of the vertical nanowire transistor 100 with reference numbers carried through from FIG. 1 to identify like features. As shown, the gate stack includes the gate dielectric 150A surrounding the channel semiconductor layer 111B with two gate electrode materials $150B_1$ and $150B_2$ surround separate portions of the gate dielectric 150A. In the exemplary embodiment, the gate electrode material $150B_1$ has a first work function, $WF_1$, proximate to the source semiconductor layer 111A, while the gate electrode material $150B_2$ has a second work function, $WF_2$, proximate to the drain semiconductor layer 111C. Notably, in some embodiments the work function of the gate electrode may be continuously varied as a function of an alloy composition in certain systems. For example, an alloy of tantalum carbon and nitrogen (TaCN) may be deposited with proportions of carbon and nitrogen affecting the work function (carbon lowering the work function, and nitrogen increasing the work function) varied along a thickness of the gate electrode.

Figure 3B:
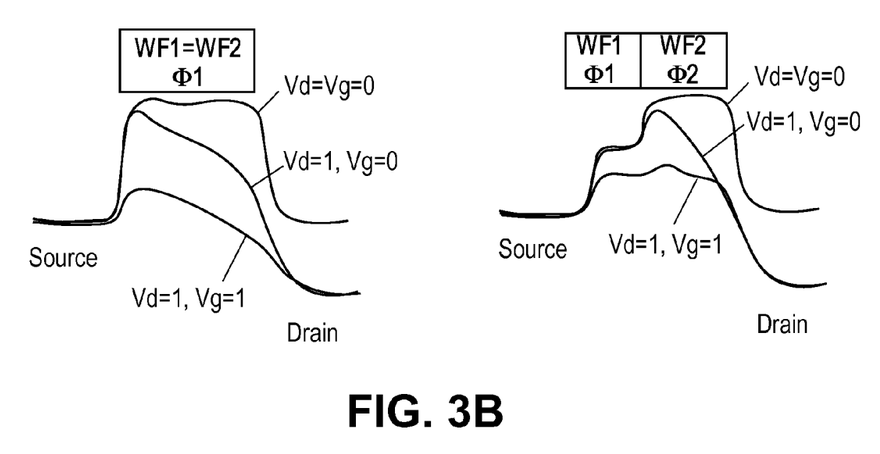
FIG. 3B is a comparison of band diagrams for single work function gate electrodes and axially engineered dual work function gate electrodes, in accordance with an embodiment of the present invention.
Figure 3C:
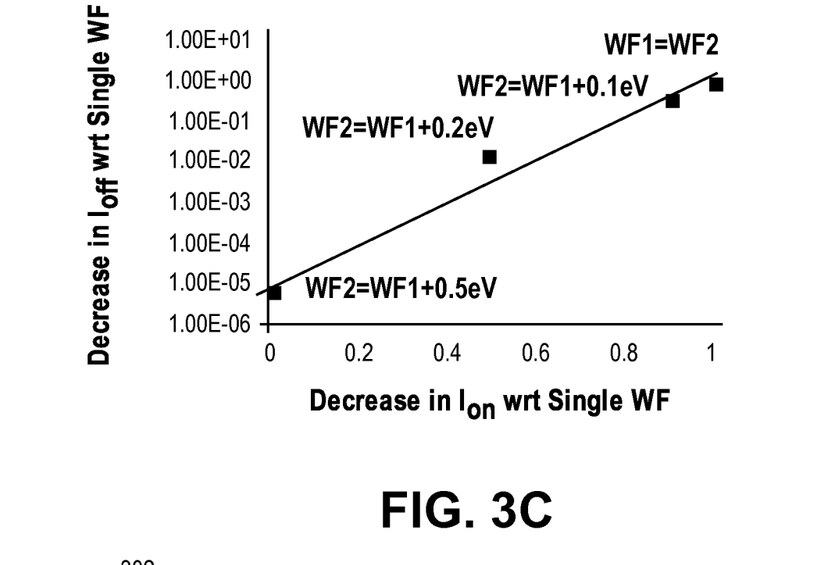
FIG. 3C is a graph comparing drive current and leakage current for transistors with single work function gate electrodes and an axially engineered dual work function gate electrode, in accordance with an embodiment of the present invention.

In one advantageous embodiment, the work function $WF_2$ is greater than the work function $WF_1$. FIG. 3B illustrates a comparison of band diagrams simulated at three bias conditions for single work function gate electrodes ($WF_1=WF_2$) and axially engineered dual work function gate electrodes ($WF_2>WF_1$), in accordance with an embodiment of the present invention. As shown in FIG. 3B, the leakage current reduction is attributable to the greater barrier height within the channel region surrounded by the gate electrode $150B_2$. As shown in FIG. 3C, increasing $WF_2$ to be greater than $WF_1$ has the effect of decreasing leakage current $I_{off}$ at a greater rate (e.g., log scale) than the on-state current $I_{on}$ (e.g., linear scale), permitting large reductions in transistor leakage current at the expense of small reductions in transistor drive current. In one group IV embodiment, where the transistor 301 is an NMOS transistor having Si and/or SiGe semiconductors layers 111A, 111B, 111C, the source-side gate electrode material $150B_1$ has the smallest work function $WF_1$, which is at least 0.1 eV less than, and advantageously 0.5 eV less, than the work function $WF_2$ at the drain-side gate electrode material $150B_2$. In certain such embodiments, $WF_2$ is in the range of 3.9-4.4 eV, while $WF_1$ is less than 3.9 eV. Many distinct metals and/or metal systems known in the art may be utilized to achieve these separate ranges, some of which may accommodate a continuous grading from $WF_1$ to $WF_2$ as an alloy composition is varied over the deposited electrode film thickness.

PMOS transistor embodiments are also possible, for example where the drain-side gate electrode material $150B_2$ has a work function $WF_2$ 0.1-0.5 eV smaller than the work function $WF_1$. For example, where the semiconductor layers are silicon or SiGe, $WF_2$ may be between 4.6 to 5.1 eV and the source-side gate electrode material 150B1 has a work function $WF_1$ greater than 5.1 eV. Many distinct metals and/or metal systems known in the art may be utilized to achieve these separate ranges, some of which may accommodate a continuous grading from $WF_1$ to $WF_2$ as an alloy composition is varied over the deposited film thickness (e.g., TaCN may be deposited with nitrogen content decreasing with increasing gate electrode deposited thickness).

Figure 3D:
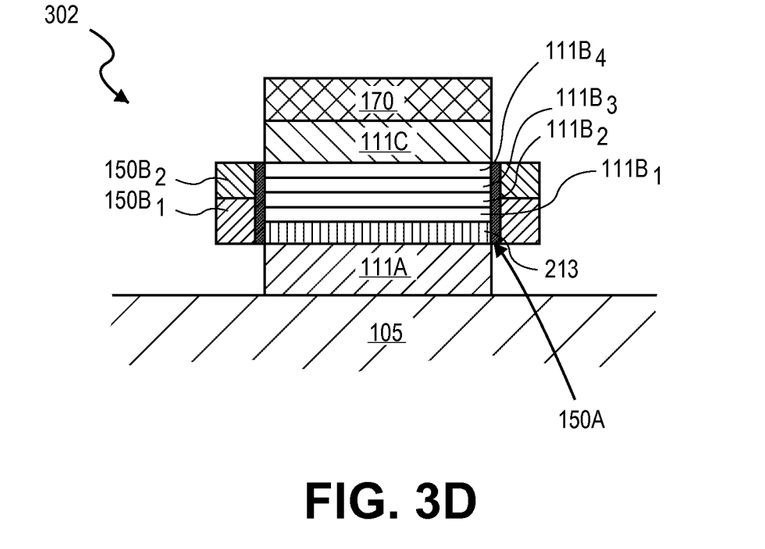
FIG. 3D is a cross-sectional view of a vertical nanowire transistor with an axially engineered channel semiconductor and an axially engineered gate electrode, in accordance with an embodiment.

In embodiments, vertical nanowire transistors include both axially engineered semiconductor layers and axially engineered gate electrode materials, as illustrated in FIG. 3D. The transistor 302 includes compositionally graded channel layers $111B_1$, $111B_2$, $111B_3$, and $111B_4$ disposed on an injection layer 213, which is further disposed on a source semiconductor layer 111A. Surrounding at least the injection layer 213 is a first gate electrode material $150B_1$ and surrounding at least some of the graded channel layers $111B_1$-$111B_4$ is at least a second gate electrode material $150B_1$ and $150B_2$. Thus, any of the features described in the context of varying semiconductor doping and composition over a length of the transistor or varying of the gate electrode material composition over a length of the channel may be combined. For certain such embodiments, synergistic effects may be achieved with the gate electrode work function and the channel semiconductor both varied. For example, a compositional variation in the channel semiconductor may magnify a difference in transistor $V_t$ induced by the differentiation in the work function. In one such embodiment, where a source end of a channel semiconductor may be of a first composition associated with a lower $V_t$ for a given gate electrode composition (e.g., SiGe with a 20-30% Ge content), and a drain end of a channel semiconductor is of a second composition associated with a higher $V_t$ for the given gate electrode composition (e.g., pure Si, or SiGe with a lower Ge content), the gate electrode composition is varied between at least two materials so that the gate electrode work function is higher at the drain side than at the source side. This may enhance the effective $V_t$ variation along the channel length where a channel semiconductor layer thickness less than 20 nm and epitaxial growth dynamics place practical limits on inter-layer or intra-layer compositional variation.

With structural features of exemplary embodiments described, fabrication techniques are briefly described in the context of FIGS. 4A-4G and 5A-5D. Generally, FIGS. 4A-4G illustrate cross-sectional views as a vertical nanowire transistor is fabricated with a primarily subtractive process beginning with device stack that is epitaxial grown as a blanket film, while FIGS. 5A-5D illustrate cross-sectional views as a vertical nanowire transistor is fabricated with an additive process employing selective epitaxy. Hybrids of such methods may also be practiced.

Figure 4A:
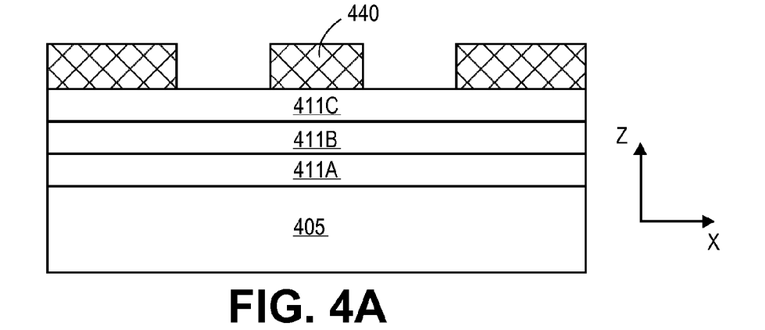
FIGS. 4A, 4B, 4C, and 4D are cross-sectional views depicting certain operations performed in fabrication of a vertical nanowire transistor, in accordance with an embodiment.
Figure 4B:
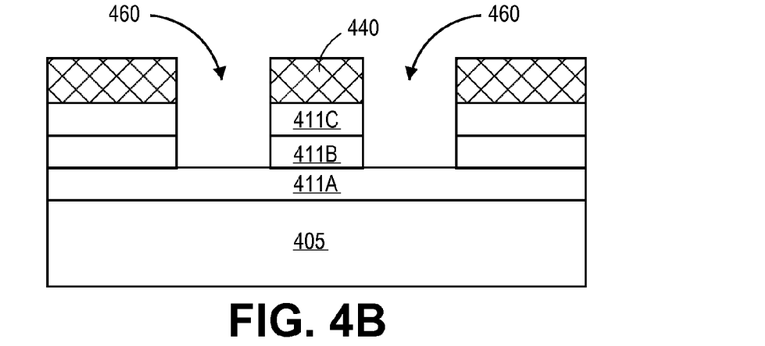

Referring first to FIG. 4A, a stack of semiconductor materials in a starting material includes a source layer 411A, a channel layer 411B, and a drain layer 411C all disposed over a substrate 405. Generally, the starting material is epitaxially growth using one or more of MOCVD, HVPE, or MBE techniques known in the art with growth conditions modified as the growth proceeds to achieve the changes in crystal composition (inter-layer or intra-layer) described elsewhere herein in the context of FIGS. 1-3D. Disposed over the semiconductor stack is a dielectric (hard mask) layer 440 that has been patterned. As shown in FIG. 4B, an annular trench 460 is etched through most of the stack, stopping on the source semiconductor layer 411A. Generally the trench etch may entail any anisotropic etch known in the art for the particular material system (e.g., group IV, group III-V). One or more dry or wet etch may be utilized. Because the channel length of the transistor is dependent on the epitaxial thickness of the channel semiconductor layer, a gate electrode need only be vertically positioned so as to ensure the entire channel can undergo inversion properly. The gate electrode can therefore be positioned to be below the interface of the source semiconductor layer and allowed to have z-height (thickness) above the drain semiconductor layer (to the extent higher gate capacitance can be tolerated). If desired, the trench 460 may be formed with a first etch having high selectivity to the source semiconductor layer 411A for positioning of the gate stack relative to the channel semiconductor layer 411B. Compositional and/or doping differences between the semiconductor layers 411A and 411B may be leveraged for the secondary purpose of etch stopping (e.g., with etchants sensitive to the dopant concentration, or compositional difference between the channel and source semiconductor layers). In one embodiment, where a Ge enhanced mobility injection layer is present at the interface of the channel and source semiconductor layers, a Ge selective etch may be utilized for precise vertical alignment of the gate electrode relative to the injection layer. After stopping the trench etch on the Ge layer, the Ge injection layer may then removed selectively to the source semiconductor layer. A timed etch selective to the source semiconductor layer (e.g., silicon) may then be employed to ensure the bottom surface of the gate electrode will be sufficiently recessed relative to the Ge injection layer.

Figure 4C:
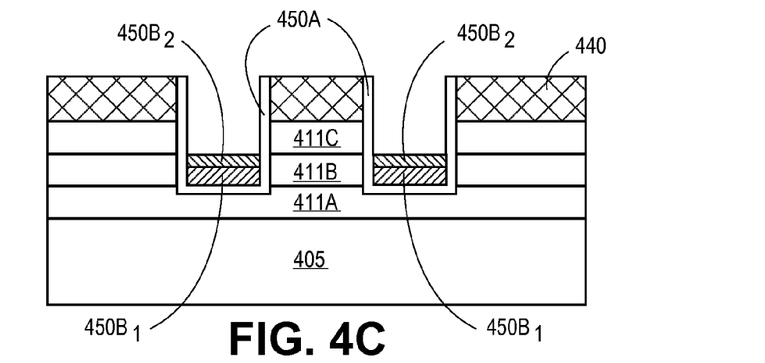
Figure 4D:
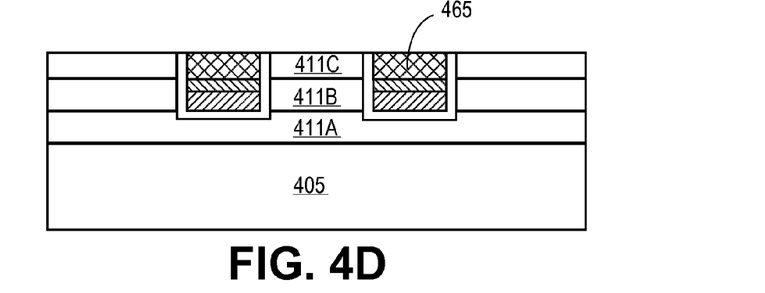

As shown in FIG. 4C, a gate dielectric 450A is deposited, for example by ALD, onto sidewalls of the channel semiconductor layer 411B. A first gate electrode material $450B_1$ is then deposited in the trench 460, advantageously with a non-conformal process, such as but not limited to physical vapor deposition (PVD). A second gate electrode material $450B_2$ is similarly deposited with the final electrode thickness advantageously extending past (above) the interface between channel semiconductor layer 411B and drain semiconductor layer 411C. As shown in FIG. 4D, a dielectric 465 is deposited, and the hard mask 440 and the dielectric 465 is then planarized to expose the drain semiconductor layer 411C in preparation for drain contact metallization.

Figure 5A:
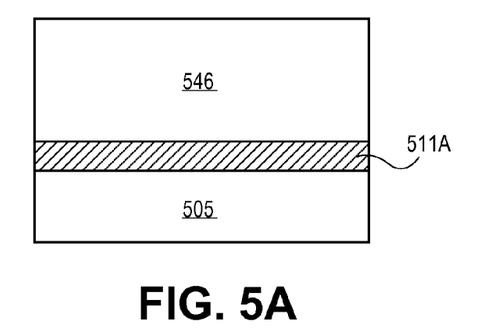
FIGS. 5A, 5B, 5C, and 5D are cross-sectional views depicting certain operations performed in fabrication of a vertical nanowire transistor, in accordance with an embodiment.
Figure 5B:
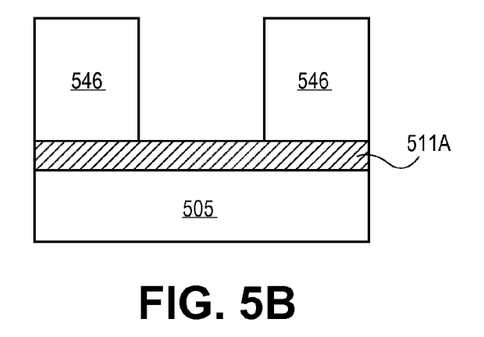
Figure 5C:
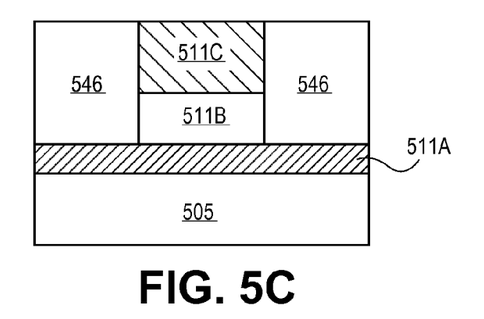

A selective epitaxial process is shown in FIG. 5A with a substrate including a dielectric 546 disposed over a source semiconductor layer 511A on a crystalline semiconductor substrate 505. A mask 546 is first patterned and an interior trench is advanced through the dielectric 546 and terminated on a stop layer (e.g., pad oxide) of the dielectric 546. Alternatively, the etch may be stopped somewhere within a thickness of the source semiconductor layer 511A. After removing the mask 546 (and dielectric etch stop layer), a selective epitaxial process (e.g., HVPE, MOCVD, etc.) is employed to form the nanowire transistor from the seeding surface of the exposed source semiconductor layer 511A within the interior trench. As shown in FIG. 5C, a semiconductor channel layer 511B is epitaxially grown from the source semiconductor layer 511A, and a drain semiconductor layer 511C is further grown over the semiconductor channel layer 511B. Generally, channel and source/drain layers are epitaxially grown using one or more of MOCVD, HVPE, or other selective epitaxy techniques known in the art with growth conditions modified as the growth proceeds to achieve the changes in crystal composition (inter-layer or intra-layer) described elsewhere herein in the context of FIGS. 1-3D. The grown film is polished back to planarize against the dielectric layer 546 as a polish stop, ensuring some drain semiconductor layer 511C is retained.

Figure 5D:
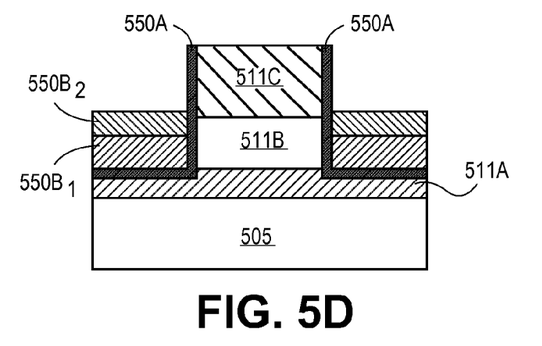

The dielectric layer 546 is recessed exposing a sidewall of the semiconductor channel layer 511B. As shown in FIG. 5D, a gate dielectric 550A is deposited, for example by ALD, onto sidewalls of the channel semiconductor layer 511B. A first gate electrode material $550B_1$ is then deposited, advantageously with a non-conformal process, such as, but not limited, to PVD. A second gate electrode material $550B_2$ is similarly deposited and terminated at a thickness sufficient to ensure the entire thickness of the channel semiconductor layer 511B will be fully coupled to the gate terminal.

Figure 6:
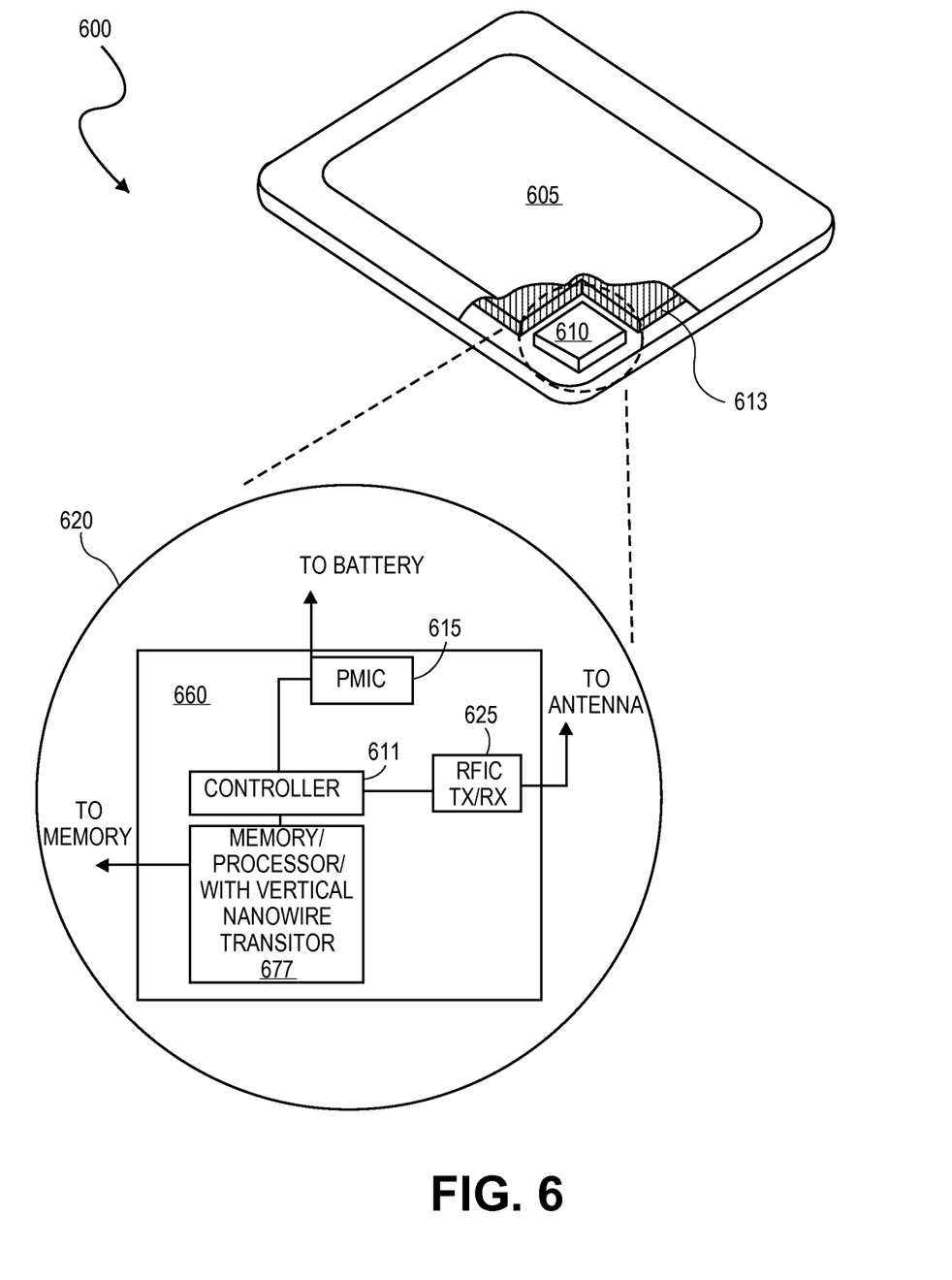
FIG. 6 is a functional block diagram of a mobile computing platform employing vertically oriented transistors, in accordance with an embodiment of the present invention.

FIG. 6 is a functional block diagram of a SOC implementation of a mobile computing platform, in accordance with an embodiment of the present invention. The mobile computing platform 600 may be any portable device configured for each of electronic data display, electronic data processing, and wireless electronic data transmission. For example, mobile computing platform 600 may be any of a tablet, a smart phone, laptop computer, etc. and includes a display screen 605, the SOC 610, and a battery 615. As illustrated, the greater the level of integration of the SOC 610, the more of the form factor within the mobile computing device 600 that may be occupied by the battery 615 for longest operative lifetimes between charging, or occupied by memory (not depicted), such as a solid state drive, DRAM, etc., for greatest platform functionality.

The SOC 610 is further illustrated in the expanded view 620. Depending on the embodiment, the SOC 610 includes a portion of a silicon substrate 660 (i.e., a chip) upon which one or more of a power management integrated circuit (PMIC) 615, RF integrated circuit (RFIC) 625 including an RF transmitter and/or receiver, a controller thereof 611, and one or more central processor core, or memory 677. In embodiments, the SOC 610 includes one or more vertical nanowire transistors (FETs) in conformance with one or more of the embodiments described herein. In further embodiments, manufacture of the SOC 610 includes one or more of the methods described herein for fabricating a vertically oriented nanowire transistor (FET).

Figure 7:
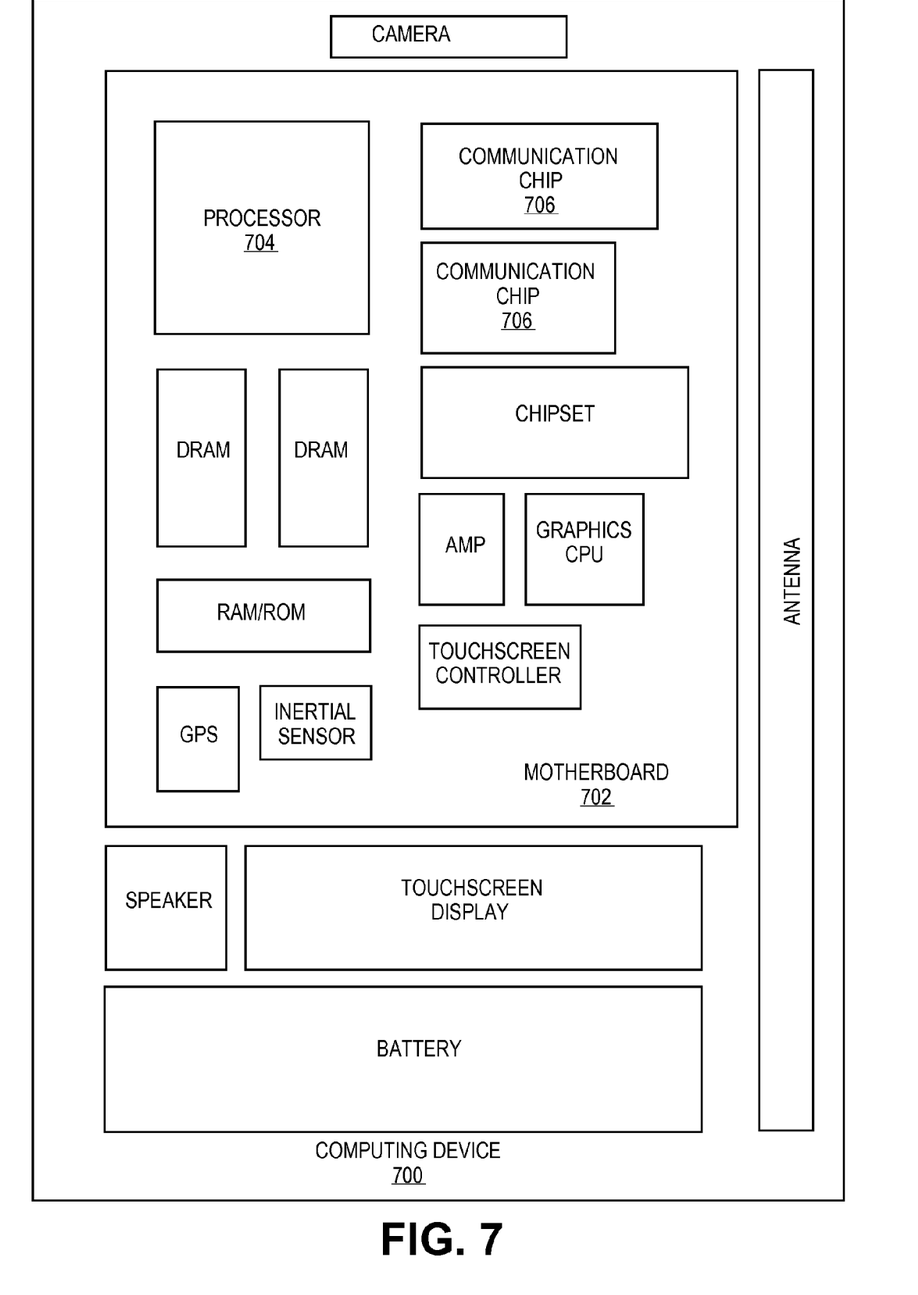
FIG. 7 illustrates a functional block diagram of computing device in accordance with one embodiment.

FIG. 7 is a functional block diagram of a computing device 700 in accordance with one embodiment of the invention. The computing device 700 may be found inside the mobile platform 1100, for example, and further includes a board 702 hosting a number of components, such as but not limited to a processor 704 (e.g., an applications processor) and at least one communication chip 706. In embodiments, at least the processor 704 includes a vertical nanowire transistor (FET) having structures in accordance with embodiments describe elsewhere herein, and/or fabricated in accordance with embodiments further described elsewhere herein. The processor 704 is physically and electrically coupled to the board 702. The processor 704 includes an integrated circuit die packaged within the processor 704. The term "processor" may refer to any device or portion of a device that processes electronic data from registers and/or memory to transform that electronic data into other electronic data that may be stored in registers and/or memory.

In some implementations the at least one communication chip 706 is also physically and electrically coupled to the board 702. In further implementations, the communication chip 706 is part of the processor 704. Depending on its applications, computing device 700 may include other components that may or may not be physically and electrically coupled to the board 702. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), digital versatile disk (DVD), and so forth).

At least one of the communication chips 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to those described elsewhere herein. The computing device 700 may include a plurality of communication chips 706. For instance, a first communication chip 706 may be dedicated to shorter-range wireless communications such as Wi-Fi and Bluetooth and a second communication chip 706 may be dedicated to longer-range wireless communications such as GPS, EDGE, GPRS, CDMA, WiMAX, LTE, Ev-DO, and others.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A vertical nanowire transistor having a longitudinal axis perpendicularly oriented to a surface plane of a crystalline substrate, the transistor comprising:
    a group IV or group III-V epitaxial source semiconductor layer vertically aligned with an epitaxial group IV or group III-V drain semiconductor layer along the longitudinal axis;
    a group IV or group III-V epitaxial channel semiconductor layer disposed between source and drain semiconductor layers, the channel semiconductor layer having an epitaxial film thickness, wherein the source semiconductor layer has a lower effective mass along a transport direction and/or a higher density of states mass in the plane perpendicular to the transport direction than that of the channel and drain semiconductor layers; and
    an annular gate electrode surrounding a sidewall of the semiconductor channel layer, separated by an annular gate dielectric layer, and wherein the composition of at least one of the gate electrode or the semiconductor layers varies along the longitudinal axis.

2. The vertical nanowire transistor of claim 1, wherein the channel semiconductor layer has a compositional variation between a first interface with the source semiconductor layer and a second interface with the drain semiconductor layer.

3. The vertical nanowire transistor of claim 2, wherein the compositional variation further comprises a grading of the channel semiconductor layer throughout the epitaxial film thickness.

4. The vertical nanowire transistor of claim 3, wherein the channel semiconductor comprises a SiGe alloy, and wherein the Ge content is higher at the first interface than at the second interface, or wherein the channel semiconductor comprises a In alloy, and wherein the In content is higher at the first interface than at the second interface.

5. The vertical nanowire transistor of claim 4, wherein the source and drain semiconductor layers are silicon with b-dopant concentration profiles aligned to the first and second interfaces.

6. The vertical nanowire transistor of claim 2, wherein the compositional variation further comprises a lightly doped or intrinsic high mobility injection layer disposed proximate to the first interface.

7. The vertical nanowire transistor of claim 6, wherein the channel semiconductor is silicon or a SiGe alloy, and wherein the high mobility injection layer is disposed directly on the source semiconductor layer and is composed of Ge.

8. The vertical nanowire transistor of claim 6, wherein the compositional variation further comprises a grading of the channel semiconductor layer from the high mobility injection layer to the second interface.

9. A vertical nanowire transistor having a longitudinal axis perpendicularly oriented to a surface plane of a crystalline substrate, the transistor comprising:
    a group IV or group III-V epitaxial source semiconductor layer vertically aligned with an epitaxial group IV or group III-V drain semiconductor layer along the longitudinal axis;
    a group IV or group III-V epitaxial channel semiconductor layer disposed between source and drain semiconductor layers, the channel semiconductor layer having an epitaxial film thickness; and
    an annular gate electrode surrounding a sidewall of the semiconductor channel layer, separated by an annular gate dielectric layer, and wherein the composition of at least one of the gate electrode or the semiconductor layers varies along the longitudinal axis, wherein the composition of the gate electrode in direct contact with the gate dielectric varies along the longitudinal axis to differentiate the work function from a first level proximate to the source semiconductor layer to a second level proximate to the drain semiconductor layer.

10. The vertical nanowire transistor of claim 9, wherein the work function of the gate electrode is greater proximate to the drain semiconductor layer than proximate to the source semiconductor layer.

11. The vertical nanowire transistor of claim 10, wherein the gate electrode composition is graded from a first alloy composition proximate to the source semiconductor layer to a second alloy composition proximate to the drain semiconductor layer.

12. The vertical nanowire transistor of claim 10, wherein the channel semiconductor layer has a compositional variation between a first interface with the source semiconductor layer and a second interface with the drain semiconductor layer, the semiconductor compositional variation to magnify a difference in transistor threshold voltage associated with the differentiation in the gate electrode work function.

13. The vertical nanowire transistor of claim 10, wherein the channel semiconductor layer further comprises a lightly doped or intrinsic high mobility injection layer disposed proximate to the source semiconductor layer.

14. A vertical nanowire transistor having a longitudinal axis perpendicularly oriented to a surface plane of a crystalline substrate, the transistor comprising:
    a group IV or group III-V epitaxial source semiconductor layer vertically aligned with an epitaxial group IV or group III-V drain semiconductor layer along the longitudinal axis;

a group IV or group III-V epitaxial channel semiconductor layer disposed between source and drain semiconductor layers, the channel semiconductor layer having an epitaxial film thickness, wherein the channel semiconductor layer has a compositional variation between a first interface with the source semiconductor layer and a second interface with the drain semiconductor layer, and wherein the compositional variation further comprises a grading of the channel semiconductor layer throughout the epitaxial film thickness; and an annular gate electrode surrounding a sidewall of the semiconductor channel layer, separated by an annular gate dielectric layer, and wherein the composition of at least one of the gate electrode or the semiconductor layers varies along the longitudinal axis.

15. The vertical nanowire transistor of claim 14, wherein the channel semiconductor comprises a SiGe alloy, and wherein the Ge content is higher at the first interface than at the second interface, or wherein the channel semiconductor comprises a In alloy, and wherein the In content is higher at the first interface than at the second interface.

16. The vertical nanowire transistor of claim 15, wherein the source and drain semiconductor layers are silicon with b-dopant concentration profiles aligned to the first and second interfaces.

17. A vertical nanowire transistor having a longitudinal axis perpendicularly oriented to a surface plane of a crystalline substrate, the transistor comprising:

a group IV or group III-V epitaxial source semiconductor layer vertically aligned with an epitaxial group IV or group III-V drain semiconductor layer along the longitudinal axis;

a group IV or group III-V epitaxial channel semiconductor layer disposed between source and drain semiconductor layers, the channel semiconductor layer having an epitaxial film thickness, wherein the channel semiconductor layer has a compositional variation between a first interface with the source semiconductor layer and a second interface with the drain semiconductor layer, wherein the compositional variation further comprises a lightly doped or intrinsic high mobility injection layer disposed proximate to the first interface, and wherein the channel semiconductor is silicon or a SiGe alloy, and wherein the high mobility injection layer is disposed directly on the source semiconductor layer and is composed of Ge; and an annular gate electrode surrounding a sidewall of the semiconductor channel layer, separated by an annular gate dielectric layer, and wherein the composition of at least one of the gate electrode or the semiconductor layers varies along the longitudinal axis.

18. A vertical nanowire transistor having a longitudinal axis perpendicularly oriented to a surface plane of a crystalline substrate, the transistor comprising:

a group IV or group III-V epitaxial source semiconductor layer vertically aligned with an epitaxial group IV or group III-V drain semiconductor layer along the longitudinal axis;

a group IV or group III-V epitaxial channel semiconductor layer disposed between source and drain semiconductor layers, the channel semiconductor layer having an epitaxial film thickness, wherein the channel semiconductor layer has a compositional variation between a first interface with the source semiconductor layer and a second interface with the drain semiconductor layer, wherein the compositional variation further comprises a lightly doped or intrinsic high mobility injection layer disposed proximate to the first interface, and wherein the compositional variation further comprises a grading of the channel semiconductor layer from the high mobility injection layer to the second interface; and an annular gate electrode surrounding a sidewall of the semiconductor channel layer, separated by an annular gate dielectric layer, and wherein the composition of at least one of the gate electrode or the semiconductor layers varies along the longitudinal axis.

\* \* \* \* \*